(12) United States Patent
Wadman et al.

(10) Patent No.: US 6,617,541 B1
(45) Date of Patent: Sep. 9, 2003

(54) LASER ETCHING METHOD

(75) Inventors: Sipke Wadman, Eindhoven (NL); Klaus B. Schildbach, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 08/391,745

(22) Filed: Feb. 21, 1995

(30) Foreign Application Priority Data

Feb. 22, 1994 (EP) .............................. 94200436

(51) Int. Cl.[7] .................. B23K 26/38; G02F 1/1343
(52) U.S. Cl. .................. 219/121.69; 349/139; 349/187
(58) Field of Search ............... 219/121.69; 427/554, 427/555, 556; 349/148, 152, 187, 139

(56) References Cited

U.S. PATENT DOCUMENTS

| | | | | |
|---|---|---|---|---|
| 3,935,117 A | * | 1/1976 | Suzuki et al. | |
| 4,081,653 A | * | 3/1978 | Koo et al. | 219/121.69 |
| 4,643,532 A | * | 2/1987 | Kleiman | |
| 4,849,363 A | * | 7/1989 | Coffey et al. | 427/554 |
| 5,187,601 A | * | 2/1993 | Yamazaki et al. | 359/87 |
| 5,235,154 A | * | 8/1993 | Economikos | 219/121.69 |
| 5,296,674 A | * | 3/1994 | Praschek et al. | 219/121.69 |
| 5,400,157 A | * | 3/1995 | Won | 359/87 |

FOREIGN PATENT DOCUMENTS

| | | | | |
|---|---|---|---|---|
| EP | 46104 | * | 2/1918 | 427/554 |
| EP | 42632 | * | 12/1981 | |
| EP | 444580 | * | 9/1991 | 359/87 |
| JP | 57-48721 | * | 9/1982 | 359/88 |
| JP | 62-267094 | * | 11/1987 | |
| JP | 4-142517 | * | 5/1992 | 359/89 |

OTHER PUBLICATIONS

J.G. Lunney et al, Excimer laser etching of transparent conducting oxides, Appl. Phys. Lett. 59 (6), Aug. 5, 1991, pp. 647–649.

* cited by examiner

Primary Examiner—Geoffrey S. Evans
(74) Attorney, Agent, or Firm—Ernestine C. Bartlett

(57) ABSTRACT

A method of furnishing a substrate with a patterned film of electrode material making use of a laser beam, whereby a stack is made by providing a surface of the substrate at least with a layer of an assistant material and an overlying layer of the said electrode material, the assistant material being capable of decomposition upon heating with the aid of the said laser beam, subsequent to which the stack is, in accordance with a desired pattern, locally irradiated with the laser beam so as to heat the assistant material to at least its decomposition temperature, consequent upon which the locally overlying electrode material is caused to detach.

13 Claims, 5 Drawing Sheets

LASER ETCHING METHOD

BACKGROUND OF THE INVENTION

The invention relates to a method of furnishing a substrate with a patterned film of electrode material, whereby use is made of a laser beam.

The invention also relates to a substrate thus furnished with a patterned film of electrode material.

The invention further relates to a display device comprising such a substrate.

Many modern devices incorporate substrates which are provided with a complex patterned film of electrically conductive material. For example, devices such as liquid crystal displays, electroluminescent displays and solar panels commonly employ transparent substrates which are furnished with a precisely patterned film of transparent electrically conductive material, serving as an electrode network. Such films are often provided using etch techniques, whereby a uniform film is first provided on a given substrate and then selectively etched away in accordance with a desired pattern. The nature of such etching processes may be chemical (employing, for example, acid mixtures), physical (using, for example, laser radiation), or a combination of both (such as with laser-induced chemical etching).

A method as described in the opening paragraph, together with a patterned substrate coating as elucidated in the second paragraph, are discussed in an article by Lunney et al. in Appl. Phys. Lett. 59 (6), pp 647–649 (1991). In the disclosed method, films of electrically conductive fluorine-doped tin oxide (430 nm thick) and indium tin oxide (150 nm thick) are directly deposited on separate glass substrates and then selectively etched away using an excimer laser (wavelength 248 nm, pulse length 23 ns). The employed laser beam is used to rapidly (locally) heat the oxide film to a temperature above its boiling point (order of magnitude 2000° C.), consequent upon which the film locally vaporises and detaches from the substrate surface.

This known method has, however, a number of attendant disadvantages, some of which can be summarised as follows:

(1) Because the electrode film must be heated to such high temperatures (order of magnitude 2000° C.), a relatively high laser fluence is required, typical values being of the order of 1–3 J cm$^{-2}$. In practice, this necessitates either the use of a very powerful laser or the use of a relatively low-power laser with a sharply focused beam. In the latter instance, which is more common, the restricted beam diameter will place an upper limit on the width of each film tract which can be irradiated in a single pass of the laser beam. Etching of large areas of the electrode material will therefore require a time-consuming scanning procedure with the focused laser;

(2) Redeposition of condensed electrode material vapour onto etched areas of the substrate is a common and serious problem. Measures aimed at removing vaporised material before it gets a chance to cool and re-attach itself to the substrate are complicated, expensive, and not entirely effective. For example, even the application of a supersonic gas stream to rapidly blow vaporised material out of the vicinity of the substrate cannot satisfactorily prevent redeposition of electrode material. Such redeposited material must therefore be removed in a supplementary etching step, which is not only time-consuming but can also cause damage to the substrate surface;

(3) Although the known laser etching process generally gives sharper pattern definition than a chemical etching process, there is nevertheless considerable remaining roughness of the various pattern edges and walls. This places definite limits on the fine resolution levels attainable with the known method.

SUMMARY OF THE INVENTION

It is an object of the invention to provide a laser etching method which allows the satisfactory use of relatively low laser fluences. It is a further object of the invention that such a method should incur a relatively low attendant risk of redeposition of etch debris. Moreover, the invention aims at the attainment of a relatively high etch definition with such a method.

These and other objects are achieved in a method as described in the opening paragraph, characterised in that a stack is made by providing a surface of the substrate at least with a layer of an assistant material and an overlying layer of the said electrode material, which assistant material is capable of decomposition upon heating with the aid of the said laser beam, subsequent to which the stack is, in accordance with a desired pattern, locally irradiated with the laser beam so as to heat the assistant material to at least its decomposition temperature, consequent upon which the locally overlying electrode material is caused to detach.

The term "decomposition" as here employed should be broadly interpreted as referring to such processes as, for example, chemical decomposition of an explosive substance, rapid boiling or sublimation of a substance having a high vapour pressure, fast emission of hot combustion gases, rapid thermal expansion of product gases produced in a chemical or physical reaction, etc., all of which result in the release of relatively large amounts of energy over a short timescale, and all of which can be induced by sudden thermal excitation (laser beam).

Such decomposition of the assistant material can be incurred by irradiating the stack with the chosen laser beam. Depending on the choice of substrate and electrode materials, and on the fluence of the employed laser, such irradiation of the stack can occur either via the substrate or via the layer of electrode material. If all materials between the laser and the assistant material are transparent to the employed laser wavelength, then the assistant material will be directly heated by radiative laser energy. However, if at least one of the materials between the laser and the assistant material is opaque to the employed laser wavelength, then the assistant material will be indirectly heated by conducted thermal energy.

The mechanism by which the electrode material is caused to detach from the underlying surface in the present invention is thus fundamentally different from the known mechanism employed in the above-discussed state of the art. Rather than being directly vaporised from the substrate surface, as in the known method, the electrode material is instead forcefully detached from the underlying assistant material as a result of that underlying material's laser-induced decomposition. Since the temperature at which the chosen assistant material decomposes can be very substantially lower than the boiling point of the given electrode material, the inventive method can be satisfactorily and advantageously enacted with a very much lower laser fluence than is necessary in the case of the known method, provided the specific heat capacity of the assistant material is less than or roughly of the same order of magnitude as that of the electrode material.

In numerous appraisal tests of the inventive method, it was repeatedly observed that electrode material removed from the underlying assistant layer was very finely pulverised. The particles of detached electrode material were in fact so small that they tended to remain suspended in the atmosphere above the etched surface (analogous to smoke particles). As a result, redeposition of etched electrode material was not observed, and suspended pulverised material could easily be blown out of the vicinity of the substrate using a common (subsonic) gas stream.

It is a surprising aspect of the inventive method that, despite the considerable energy involved in the decomposition of the assistant material, the topographical and geometrical etching definition obtained with the inventive method is actually extremely sharp, and represents a considerable improvement with respect to the etching definition typically obtainable with the method according to the above-elucidated state of the art.

Because the inventive method requires a relatively low laser fluence, it lends itself particularly to the rapid etching of relatively large patterns. Such patterns can, of course, be etched simply by running a focused laser spot along preselected routes on the stack, but such a procedure is very time-consuming for relatively large film areas. An alternative method, which is far quicker, is to project and focus a broadened laser beam through a pre-patterned stencil plate onto (large areas of) the entire stack, thereby simultaneously heating all regions of the assistant material which are to be decomposed. Broadening a given laser beam in this way decreases the imparted laser fluence in the focal plane, but this decrease is compensated by the intrinsically lower laser fluence necessitated by the inventive method in the first place. Although one might expect diffraction effects to adversely affect the quality of the etching definition in the case of such a wide-projection procedure, experiments have shown that the sharpness of patterns etched in this manner is nevertheless highly satisfactory.

DETAILED DESCRIPTION OF THE INVENTION

Figure 1:
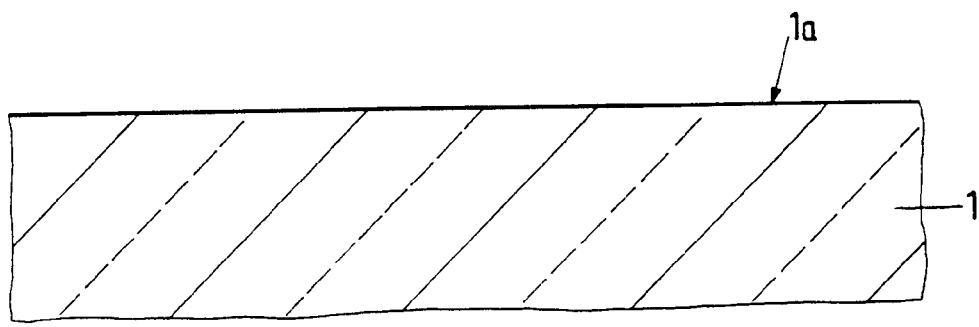
FIG. 1 is a cross-sectional view of part of a substrate which is to be provided with a patterned film of electrode material using the method according to the invention.

A particularly advantageous embodiment of the method according to the invention is characterised in that an organic polymer is selected as the assistant material. Many organic polymers decompose at relatively low temperatures (order of magnitude 250° C.), thereby allowing the use of correspondingly low laser fluences in the inventive method. Moreover, organic polymers generally have relatively low thermal conductivities, so that unwanted lateral transmission of thermal energy within the assistant layer is hereby impeded. In addition, organic polymers are, in general, easily deposited on most common substrate materials by techniques such as spin coating. A further advantage of organic polymers is their poor electrical conductivity, which ensures that they do not disturb the intended electrical properties of an overlying patterned electrode layer.

A preferential embodiment of the method according to the invention is characterised in that the selected assistant material is a polyacrylate. Polyacrylates generally undergo chemical decomposition, with strong attendant gas emission, at temperatures in the range 200–250° C. In addition, compounds in this group are relatively cheap and widely available.

Typical electrode materials suitable for satisfactory employment in the inventive method include both metals and metal oxides. Satisfactory thermal conductivity of these materials facilitates an efficient transfer of irradiated laser energy through to the underlying layer of assistant material, where it is necessary to instigate decomposition. Moreover, films of these materials can easily be deposited using techniques such as, for example, sputter deposition, vapour deposition and laser ablation deposition, conducted either in vacuum (when depositing metals) or in an oxygen atmosphere (when depositing metal oxides). In addition, optically transparent metal oxide lend themselves to electrode applications in opto-electric instruments such as Liquid Crystal Display (LCD) devices.

Particularly advantageous metal oxides suitable for application as electrode materials in the inventive method include indium oxide, tin oxide, and mixtures thereof. A specific material falling within this category is Indium Tin Oxide (ITO), $In_2O_3/SnO_2$. The relatively high melting points (order of magnitude 1000° C.) and boiling points (order of magnitude 2000° C.) of these materials are partly responsible for the high definition with which they can be etched using the inventive method, since "edge melting" and other thermal deformation will be greatly limited at the relatively low etching temperatures (low laser fluences) associated with the inventive method. Moreover, these materials have a relatively low electrical resistivity, high optical transmissivity, good adhesion characteristics, high resistance to discolouration, and can easily be soldered to electrical contacts, thereby making them suitable for a wide range of electrode applications, particularly in display devices.

Typical substrate materials suitable for use with the inventive method include soda lime glass, borosilicate glass and quartz. These materials have relatively high melting points (order of magnitude 1000° C.), so that they are not easily damaged by stray thermal energy. Once again, their optical transparency makes them suitable for use in display devices.

Various types of laser have been found to be suitable for application in the inventive method. The particular laser used, together with the chosen wavelength and power, will be determined inter alia by the choice of electrode, assistant and substrate materials, the thicknesses of the various layers, the size of the desired electrode pattern, and the required etching rate. Typically suitable lasers include ArF, KrF and XeCl excimer lasers, having respective wavelengths of 193, 248 and 308 nm.

In stacks as hereabove elucidated, it is of course possible to employ additional layers of material other than those already discussed, without hindering the successful enaction of the inventive method. Such additional layers can fulfil many device-oriented functions, and may include, for example, colour filter layers, spacer layers, reinforcement layers, protective layers, etc. They may be situated, for example:

(1) At the side of the substrate remote from the assistant material;
(2) Between the substrate and the assistant material;
(3) Between the assistant material and the electrode material;
(4) At the side of the electrode material remote from the substrate.

If the assistant layer is heated via the electrode layer, then the additional layer in cases (3) and (4) above should preferably be substantially transparent to the employed laser wavelength, and should preferably have a melting point well above the decomposition temperature of the assistant material. If, on the other hand, the assistant layer is heated via the substrate, then these same considerations apply in cases (1) and (2) above.

It is, of course, also possible to enact various supplementary process steps in addition to those constituent process steps of the inventive method already elucidated hereabove. Such supplementary process steps can occur, for example, prior to provision of the assistant material on the substrate, between provision of the assistant and electrode materials, or before, during or after irradiation of the stack with the laser beam, and may include, for example, cleaning, polishing or marking procedures, heating processes or various chemical treatments.

The method according to the present invention can also be used to successively provide a single substrate with a stacked multiplicity of patterned electrode films. After provision of a single patterned film as hereabove described, that film is subsequently coated with a covering layer of electrically insulating material, which can then serve as a substrate for the next patterned film to be provided. Such a covering layer can be deposited and further processed using standard techniques well known in the art.

It should be noted that the thicknesses of the substrate and various layers hereabove elucidated need not be uniform for the successful enaction of the inventive method. Depending on device requirements and specifications, the substrate and various layers may be, for example, bevelled, hollowed or otherwise contoured. The employed laser fluence can then be chosen so as to make allowance for any occurring thickness variations. For example, the fluence may be continually adjusted so as to cause decomposition in a given fixed thickness of assistant material at all locations within the pattern, or the fluence may be kept fixed at a value which is sufficient to allow satisfactory etching at points where the (cumulative) layer thicknesses are greatest.

Even when the layers are flat and of uniform thickness, the fluence may be chosen in such a manner that, if so desired, the assistant material is not decomposed throughout its full depth, but only throughout a layer of limited thickness immediately adjacent to the overlying electrode material (in the case of irradiation via the electrode layer). An uninterrupted mantel of unetched assistant material will then remain between the substrate and the patterned electrode layer.

The invention and its attendant advantages will be further elucidated with the aid of exemplary embodiments and the accompanying schematic drawings, not of uniform scale.

EMBODIMENT 1

FIG. 1 shows a substrate 1 which is to be provided with a patterned film of electrode material using the method according to the present invention, various phases of this method being depicted in ensuing FIGS. 2–6. Identical parts in the various Figures are denoted by the same reference symbols.

FIG. 1 depicts part of a transparent borosilicate glass substrate 1 having a smooth, clean surface 1a which is to be provided with a patterned film of electrode material.

Figure 2:
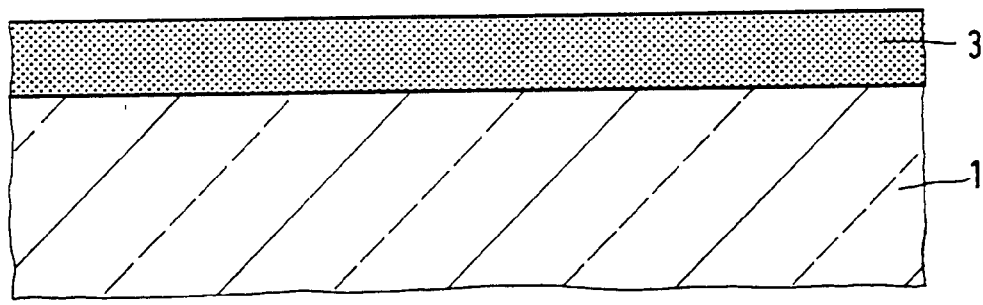
FIGS. 2 and 3 are cross-sectional views of the substrate shown in FIG. 1, after respective enaction of a first and second process step according to the inventive method.

In FIG. 2, the surface 1a has been spin-coated with a layer 3 of transparent polyacrylate assistant material, having an approximate thickness of 150 nm.

Figure 3:
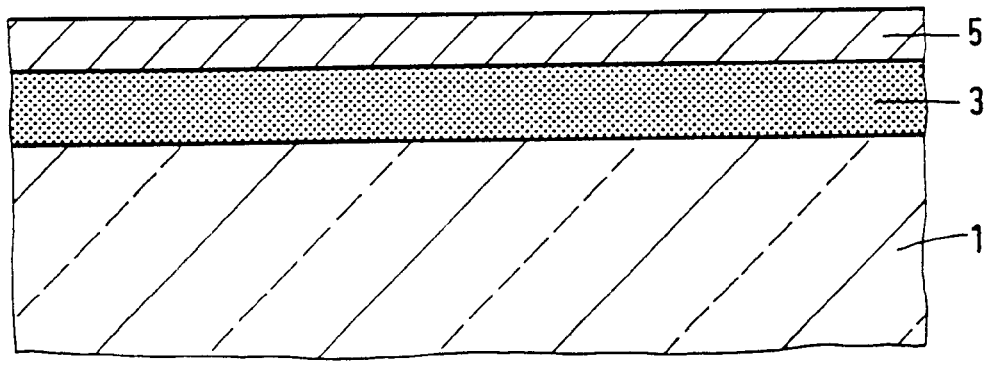

In FIG. 3, an essentially uniform film 5 of indium tin oxide (ITO) electrode material has been evaporated onto the assistant layer 3. The layer 5 is approximately 135 nm thick.

Figure 4:
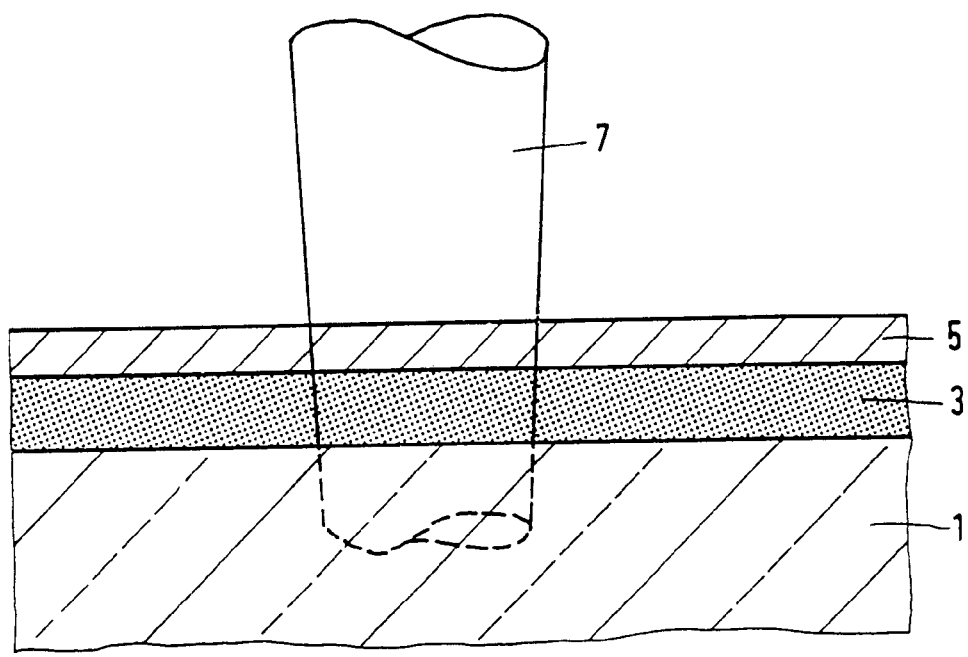
FIGS. 4–6 show the stack depicted in FIG. 3, during various etching phases in accordance with the inventive method.

FIG. 4 depicts localised irradiation of (at least) the assistant layer 3 with a focused laser beam 7, via the electrode layer 5. The applied laser is an argon fluoride (ArF) excimer laser, with a wavelength of 193 nm and a pulse length of approximately 20 ns. The employed fluence lies in the range 0.2–0.3 J cm$^{-2}$.

Figure 5:
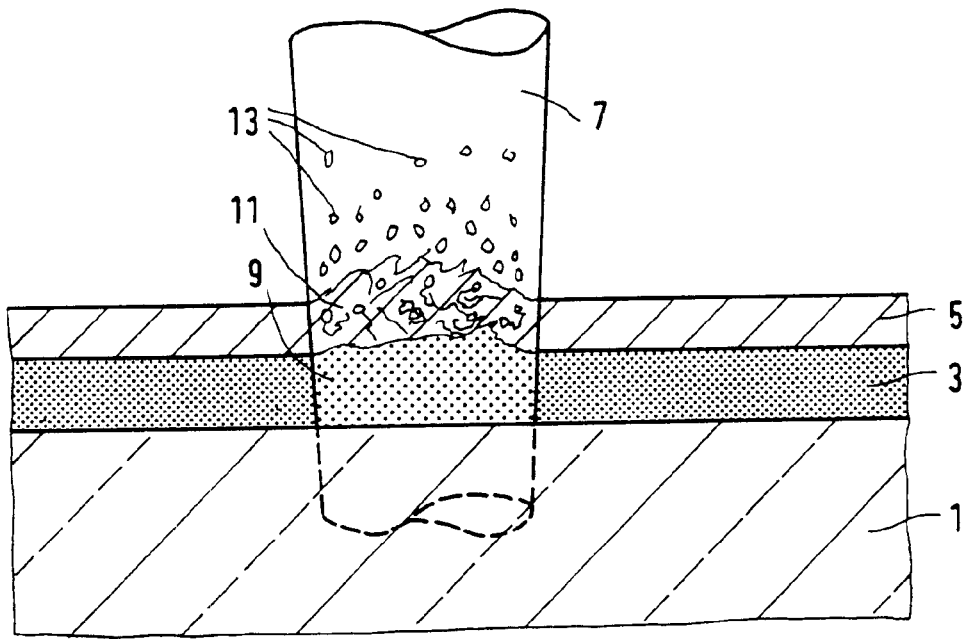

The laser beam 7 rapidly heats a confined region 9 of the assistant layer 3 to a temperature above the decomposition temperature of its constituent polyacrylate material (approximately 250° C.). As a result, the polyacrylate in the heated region 9 decomposes, emitting sufficient quantities of gas and vapour to cause mechanical detachment and forceful ejection of the electrode material in the immediately overlying region 11, as depicted in FIG. 5.

This decomposition process is so energetic that the electrode material ejected from the region 11 is finely pulverised. The debris particles 13 are so fine that they tend to remain suspended in the atmosphere above the substrate, and can therefore easily be blown away. As a result, there is no unwanted redeposition of etched electrode material on newly exposed regions of the surface 1a.

Figure 6:
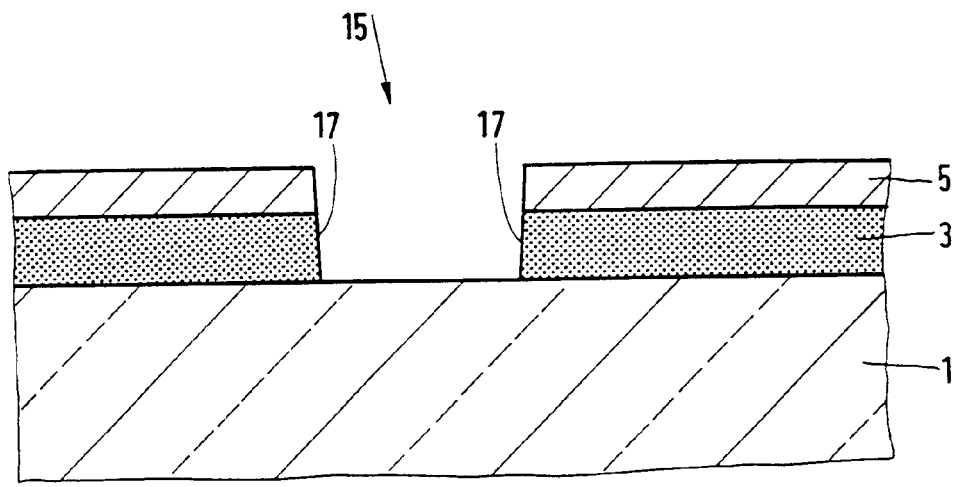

FIG. 6 shows the result of exposure to a single laser pulse as hereabove elucidated. The assistant and electrode materials have been completely removed from the heated region, leaving a neat pit 15 with sharply defined edges 17.

By translating the laser beam 7 along a pre-defined path on the surface of the layer 5, a trench can thus be etched out of the layers 3, 5. Unetched areas of the electrode layer 5 then remain behind as sharply defined electrodes, connection tracks, pixels, etc.

EMBODIMENT 2

Figure 7:
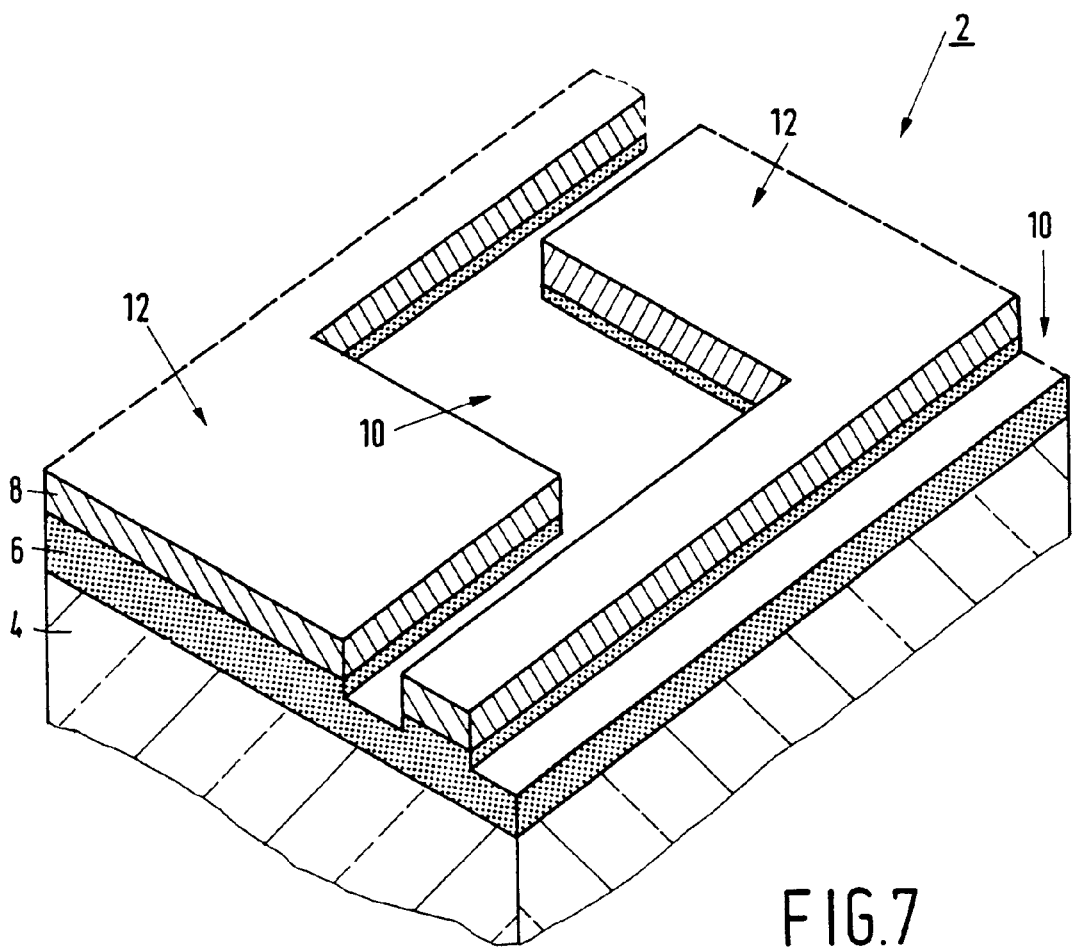
FIG. 7 is a perspective view of part of a substrate which has been provided with a patterned film of electrode material using the method according to the invention.

FIG. 7 renders a perspective view of part of a sub-assembly 2 manufactured according to the inventive method and suitable for application in a display device.

A soda lime glass substrate 4 is successively coated with a 400 nm layer of transparent polyacrylate assistant material 6 and a 350 nm film of fluorine-doped tin oxide electrode material 8. Using a pulsed krypton fluoride (KrF) excimer laser of wavelength 248 nm and a laser fluence of 0.3 J cm$^{-2}$, directed through the electrode layer 8, well-defined tracts 10 are etched out of the layers 6, 8 according to a desired pattern, leaving behind isolated portions 12 of electrode material.

The employed laser fluence is insufficient to cause etching throughout the full depth of the assistant layer 6. However, since the polyacrylate layer 6 is an electrical insulator, the presence of an uninterrupted polyacrylate mantel between the substrate 4 and the etched electrode layer 8 will not cause electrical short circuits.

The electrode portions 12, present in multiplicity, can serve the function of pixels in, for example, a liquid crystal display device.

EMBODIMENT 3 (not according to the invention)

In tests of the known state of the art hereabove elucidated, a soda lime glass substrate was directly coated with a 350 nm film of fluorine-doped tin oxide, without the presence of an intervening layer of assistant material. The oxide layer was then etched using the method known from the state of the art, whereby a pulsed KrF laser (wavelength 248 nm) was employed to locally vaporise the oxide electrode layer according to a given pattern.

Complete removal of this oxide layer throughout its entire depth required a laser fluence of 2.4 J cm$^{-2}$. This is a factor eight higher than the satisfactorily employed laser fluence in Embodiment 2 hereabove.

EMBODIMENT 4

Figure 8:
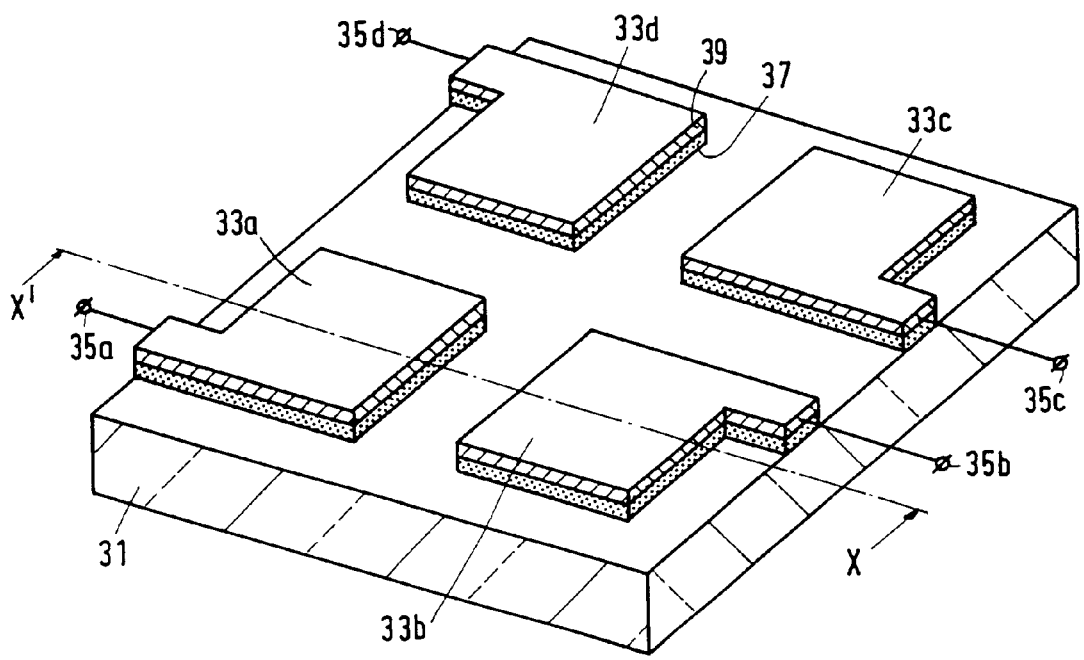
FIGS. 8–10 show various aspects of a liquid crystal display device comprising substrates provided with a patterned electrode layer using the inventive method.
Figure 9:
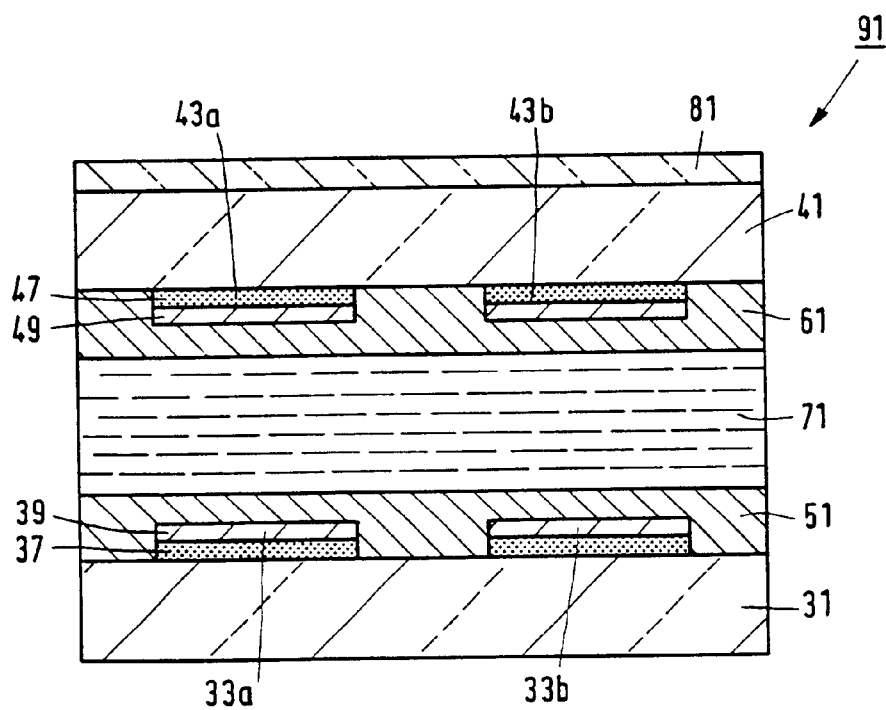
Figure 10:
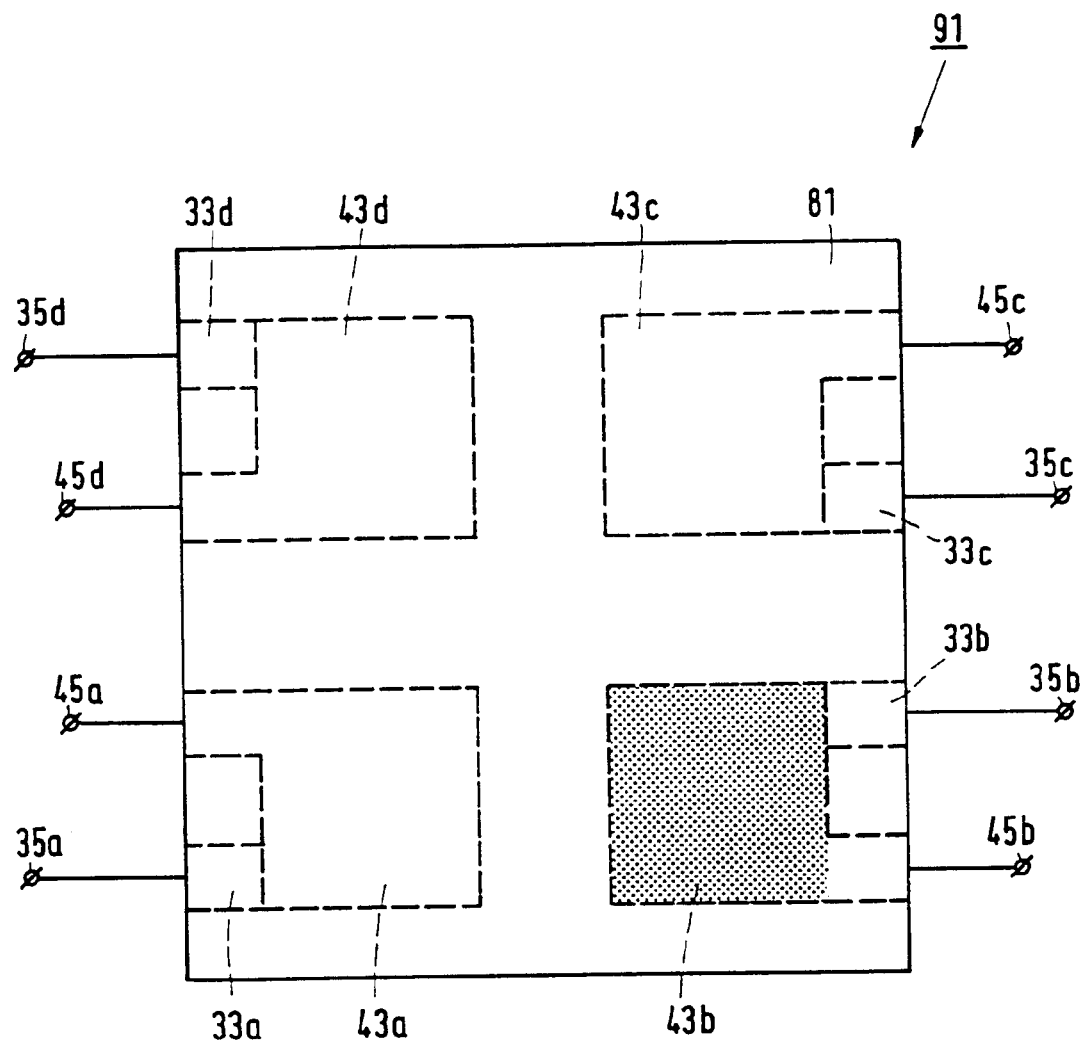

FIGS. 8–10 schematically show various aspects of a liquid crystal display device according to the invention. Identical parts in the various Figures are denoted by the same reference symbols.

FIG. 8 is a perspective view of a glass substrate 31 which has been furnished with a patterned layer of electrode material using the present inventive method. This patterned layer takes the form of four isolated, optically transparent electrodes 33a, 33b, 33c and 33d, which are essentially square in shape, except for a small protrusion connecting each electrode with an edge of the substrate 31, where respective electrical contacts 35a, 35b, 35c and 35d can be made. Each of the four electrodes comprises a polyacrylate underlayer 37 and a covering ITO layer 39.

In FIG. 9, two such substrates as depicted in FIG. 8 have been incorporated into an LCD device 91, which is here shown in cross-section along the line XX' in FIG. 8. The electrodes 33a, 33b, 33c and 33d, and the surrounding surface of the substrate 31, have herein been coated with a layer 51 of optically transparent electrically insulating material, such as silicon oxide or silicon nitride.

A second such substrate 41, with electrodes 43a, 43b, 43c and 43d and respective edge contacts 45a, 45b, 45c and 45d, identical in every way to the subject of FIG. 8 and manufactured using the same inventive method, has similarly been coated with a layer 61 of optically transparent silicon oxide or silicon nitride.

The substrates 31, 41 are accurately positioned above one anther so that corresponding electrodes directly face each other across an intervening layer 71 of liquid crystal material. A layer 81 of polaroid material is then provided on one side of the resulting stack.

FIG. 10 is a plan view of the subject of FIG. 9, seen through the polaroid layer 81. A suitable electrical voltage has been applied between the contacts 35b and 45b, thus creating an electrical field throughout the intervening liquid crystal material between the overlapping surfaces of electrodes 33b and 43b. As a result of this electrical field, the polarisation state of this intervening liquid crystal material changes in such a manner that, when viewed through the polaroid sheet 81, it is seen to become locally opaque i.e. it becomes dark in colour (shaded square region in FIG. 10). When the electrical voltage between contacts 35b and 45b is again relaxed, this darkened region regains its original colour.

Similarly, by applying suitable electrical voltages between the other electrical contact pairs (35a, 45a), (35c, 45c) and (35d, 45d), controlled localized opacity will be occur in the overlapping regions of electrode pairs (33a, 43a), (33c, 43c) and (33d, 43d), respectively, as viewed through the polaroid material layer 81. In this way, the device 91 can be used to display patterned information.

A more common embodiment of the device 91 hereabove described comprises two sets of seven oblong electrodes arranged in the form of a figure "8". Such a seven segment display can be used to depict, for example, the digits 0–9 in a familiar manner.

What is claimed is:

1. A method of furnishing a substrate with a patterned film of electrode material, said method comprising providing a surface of said substrate with a layer of an assistant material capable of decomposition and separation from said substrate upon heating with a laser beam, providing a layer of electrode material in contact with a surface of said assistant material, locally heating said layer of assistant material with said laser beam according to A desired pattern, at least to the decomposition temperature of said assistant material, to thereby cause said layer of assistant material to locally decompose and separate from said substrate in a manner so as to cause the layer of said electrode material to be separated from said substrate at areas of said local decomposition and separation of underlying assistant material and thereby form a patterned film of said electrode material on said substrate.

2. A method according to claim 1, characterised in that an organic polymer is the assistant material.

3. A method according to claim 2, characterised in that the organic polymer is a polyacrylate.

4. A method according to claim 3, characterized in that a metal oxide is selected as the electrode material.

5. A method according to claim 3, characterized in that the substrate material is selected from the group consisting of soda lime glass, borosilicate glass and quartz.

6. A method according to claim 2, characterized in that a metal oxide is selected as the electrode material.

7. A method according to claim 2, characterized in that the substrate material is selected from the group consisting of soda lime glass, borosilicate glass and quartz.

8. A method according to claim 1, characterised in that a metal oxide is the electrode material.

9. A method according to claim 8, characterised in that the metal oxide is selected from the group consisting of oxides In, Sn, and mixtures thereof.

10. A method according to claim 9, characterized in that the substrate material is selected from the group consisting of soda lime glass, borosilicate glass and quartz.

11. A method according to claim 8, characterized in that the substrate material is selected from the group consisting of soda lime glass, borosilicate glass and quartz.

12. A method according to claim 1 characterised in that the substrate material is selected from the group consisting of a soda lime glass, borosilicate glass and quartz.

13. A liquid crystal display device comprising a substrate furnished with a patterned film of electrode material formed by a method of said substrate with a layer of an assistant material capable of decomposition and separation from said substrate upon heating with a laser beam, providing a layer of electrode material in contact with a surface of said assistant material, locally heating said layer of assistant material with said laser beam according to a desired pattern, at least to the decomposition temperature of said assistant material, to thereby cause said layer of assistant material to locally decompose and separate from said substrate in a manner so as to cause the layer of said electrode material to be separated from said substrate at areas of said local decomposition and separation of underlying assistant material and thereby form a patterned film of said electrode material on said substrate.

* * * * *